(12) United States Patent
Shi et al.

(10) Patent No.: US 9,964,572 B2
(45) Date of Patent: May 8, 2018

(54) WIDE-AREA MEASUREMENT SYSTEM BASED CONTROL OF GRID-SCALE STORAGE FOR POWER SYSTEM STABILITY ENHANCEMENT

(71) Applicant: NEC Laboratories America, Inc., Princeton, NJ (US)

(72) Inventors: Di Shi, San Jose, CA (US); Ratnesh Sharma, Fremont, CA (US); Feng Guo, Columbus, OH (US)

(73) Assignee: NEC Corporation (JP)

( * ) Notice: Subject to any disclaimer, the term of this patent is extended or adjusted under 35 U.S.C. 154(b) by 200 days.

(21) Appl. No.: 15/019,610

(22) Filed: Feb. 9, 2016

(65) Prior Publication Data
US 2016/0241035 A1 Aug. 18, 2016

Related U.S. Application Data

(60) Provisional application No. 62/115,243, filed on Feb. 12, 2015.

(51) Int. Cl.
*H02J 3/32* (2006.01)
*G01R 21/133* (2006.01)
(Continued)

(52) U.S. Cl.
CPC ........... *G01R 21/133* (2013.01); *G01R 23/00* (2013.01); *H02J 3/32* (2013.01); *H02J 13/0013* (2013.01);
(Continued)

(58) Field of Classification Search
CPC ... G01R 21/133; G01R 23/00; H02J 13/0013; H02J 3/32; Y02E 60/7807; Y02E 60/722; Y04S 40/12; Y04S 10/14
See application file for complete search history.

(56) References Cited

U.S. PATENT DOCUMENTS 7,630,863 B2 * 12/2009 Zweigle ............. G01R 19/2513
                                              702/177
8,022,575 B2 * 9/2011 Korba ....................... H02J 3/24
                                              307/102

(Continued)

OTHER PUBLICATIONS

Turunen, Jukka. "A Wavelet-based Method for Estimating Damping in Power Systems." Department of Electrical Engineering, Mar. 2011, 143 pages.

(Continued)

*Primary Examiner* — Jung Kim
(74) *Attorney, Agent, or Firm* — Joseph Kolodka (57) ABSTRACT

A method and system are provided. The method includes collecting, from a plurality of phasor measurement units, a plurality of synchronized phasor measurements from different portions of a power system. The method further includes estimating, by a controller, oscillation modes of the plurality of synchronized phasor measurements. Each estimated oscillation mode specifies, for each of the plurality of synchronized phasor measurements, two or more of an amplitude, a phase, a frequency, and damping coefficients. The method also includes performing, by the controller, a modal analysis of the oscillation modes of the plurality of synchronized phasor measurements to identify critical modes based on critical mode identifying criteria. The method additionally includes constructing, by the controller based on the critical modes, a power system oscillation dampening control signal for controlling a grid-scale storage portion of the power system to dampen one or more oscillations of the power system at any given time.

19 Claims, 6 Drawing Sheets

(51) Int. Cl.
*G01R 23/00* (2006.01)
*H02J 13/00* (2006.01)

(52) U.S. Cl.
CPC ......... *Y02E 60/722* (2013.01); *Y02E 60/7807* (2013.01); *Y04S 10/14* (2013.01); *Y04S 40/12* (2013.01)

(56) References Cited

U.S. PATENT DOCUMENTS 8,497,602 B2 * 7/2013 Korba .................. H02J 3/24
307/105
9,568,513 B2 * 2/2017 Venkatasubramanian ................
G01R 19/2513

OTHER PUBLICATIONS

Kawabe, et al., "Improvement of Angle and Voltage Stability by Control of Battery Using Wide-Area Measurement System in Power Systems," 2012 3rd IEEE PES Innovative Smart Grid Technologies Europe (ISGT Europe), Berlin, Oct. 2012, pp. 1-7.

C. Vartnian, "Grid Stability Battery Systems for Renewable Energy Success," 2010 IEEE Energy Conversion Congress and Exposition (ECCE), Sep. 2010, pp. 132-135.

Ma, et al., "WAMS Based Damping Control of Inter-area Oscillations Employing Energy Storage System," Advances in Electrical and Computer Engineering, Nov. 2012, pp. 33-40, vol. 12, No. 2.

* cited by examiner

WIDE-AREA MEASUREMENT SYSTEM BASED CONTROL OF GRID-SCALE STORAGE FOR POWER SYSTEM STABILITY ENHANCEMENT

RELATED APPLICATION INFORMATION

This application claims priority to provisional application Ser. No. 62/115,243 filed on Feb. 12, 2015, incorporated herein by reference.

BACKGROUND

Technical Field

The present invention relates to power systems, and more particularly to Wide-area Measurement System (WAMS) based control of Grid-Scale Storage (GSS) for power system stability enhancement.

Description of the Related Art

Deregulation of the electricity market has pushed the power transmission grid to its transfer limit. The increasing penetration of renewable energy resources is stressing the power grid with great uncertainties due to their high degree of intermittency. As a result, a power grid is more likely to experience transient frequency fluctuation and oscillations, which may lead to system instability or even cascading failure and blackout.

Traditionally, a Power System Stabilizer (PSS) is used to enhance power system angular stability by providing supplemental damping to the oscillation of synchronous machine rotors through the generator excitation. The damping is provided by an electric torque applied to the rotor which is in phase with the speed variation. PSS helps extend the transfer capability of a tie-line in a power system so that the thermal limit of the tie-line can be reached. The supplemental control provided by PSS is very beneficial during line outages and large power transfers between areas.

However, PSS suffers from a number of limitations/drawbacks. For example, one such limitation/drawback is that under certain circumstances, PSS can provide negative damping on the rotor which leads to power system instability.

Another such limitation/drawback is that PSS parameters are usually designed offline based on a linearized model of the non-linear power system with the assumption that the oscillation modes do not change under different grid operating conditions. This design philosophy often degrades the performance of PSS when a power system experiences a large change or the power system behaves in a more non-linear way under large disturbances. This limitation becomes more obvious with the increasing penetration of renewable energy resources.

Yet another such limitation/drawback is that PSS is designed to damp a particular critical oscillation mode. When multiple oscillation modes appear due to changes in system operating conditions, PSS becomes less effective.

Still another such limitation/drawback is that PSS uses only local information for damping control and is thus most effective for damping local oscillations while its effectiveness in damping inter-area mode oscillations is limited.

SUMMARY

These and other drawbacks and disadvantages of the prior art are addressed by the present principles, which are directed to Wide-area Measurement System (WAMS) based control of Grid-Scale Storage (GSS) for power system stability enhancement.

According to an aspect of the present principles, a method is provided. The method includes collecting, from a plurality of phasor measurement units by a wide-area measurement system, a plurality of synchronized phasor measurements from different portions of a power system. The method further includes estimating, by a hardware-based controller, oscillation modes of the plurality of synchronized phasor measurements. Each of the estimated oscillation modes specifies, for each of the plurality of synchronized phasor measurements, two or more of an amplitude, a phase, a frequency, and damping coefficients. The method also includes performing, by the hardware-based controller, a modal analysis of the oscillation modes of the plurality of synchronized phasor measurements to identify critical modes based on critical mode identifying criteria. The method additionally includes constructing, by the hardware-based controller based on the critical modes, a power system oscillation dampening control signal for controlling a grid-scale storage portion of the power system to dampen one or more oscillations of the power system at any given time.

According to another aspect of the present principles, a power oscillation control system is provided for a power system. The power oscillation control system includes a hardware-based controller having a signal generator. The hardware-based controller is configured to receive a plurality of synchronized phasor measurements obtained from different portions of a power system by a plurality of phasor measurement units through a wide-area measurement system. The hardware-based controller is further configured to estimate oscillation modes of the plurality of synchronized phasor measurements. Each of the estimated oscillation modes specifies, for each of the plurality of synchronized phasor measurements, two or more of an amplitude, a phase, a frequency, and damping coefficients. The hardware-based controller is further configured to perform a modal analysis of the oscillation modes of the plurality of synchronized phasor measurements to identify critical modes based on critical mode identifying criteria. The hardware-based controller is additionally configured to construct, based on the critical modes, a power system oscillation dampening control signal for controlling a grid-scale storage portion of the power system to dampen one or more oscillations of the power system at any given time.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to Wide-area Measurement System (WAMS) based control of Grid-Scale Storage (GSS) for power system stability enhancement.

In an embodiment, the present principles provide a control method which integrates phasor measurement information from the Wide-Area Measurement System into the energy management system (EMS) of Grid-scale Storage (GSS). In an embodiment, the present principles provide a WAMS-based adaptive closed-loop control system for GSS to damp the oscillations of the power system so as to enhance its stability and reliability.

Compared to the aforementioned transient stability problem, low frequency inter-area oscillation has a much larger time scale and is usually less demanding on real-time requirements. In power systems, an inter-area oscillation mode usually has frequency ranging from 0.2 Hz to 1 Hz. In an embodiment of the present principles, Grid-Scale Storage (GSS) is used to damp inter-area oscillations by controlling GSS charging and discharging at the proper timing. Power transmission reliability criteria typically require a minimum damping ratio of 3%. This means that the GSS only needs to compensate a small portion of the power swing during the oscillation. The present principles control the GSS to charge and discharge the GSS at exactly the opposite phase of the oscillation, that is, discharge at the positive phase/peak of the oscillation and charge at the negative phase/peak of the oscillation.

Figure 1:
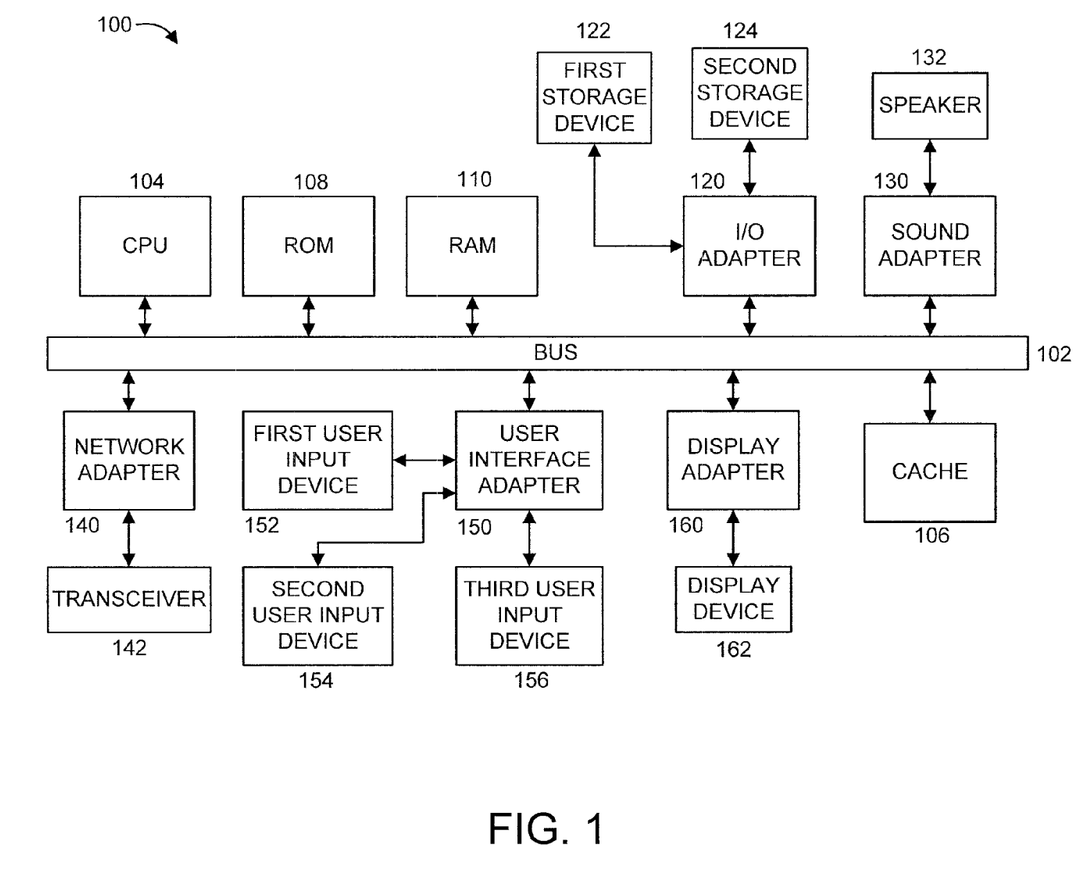
FIG. 1 is a block diagram illustrating an exemplary processing system 100 to which the present principles may be applied, according to an embodiment of the present principles.

Referring now in detail to the figures in which like numerals represent the same or similar elements and initially to FIG. 1, a block diagram illustrating an exemplary processing system 100 to which the present principles may be applied, according to an embodiment of the present principles, is shown. The processing system 100 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 152, 154, and 156 can be the same type of user input device or different types of user input devices. The user input devices 152, 154, and 156 are used to input and output information to and from system 100.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present principles provided herein.

Figure 2:
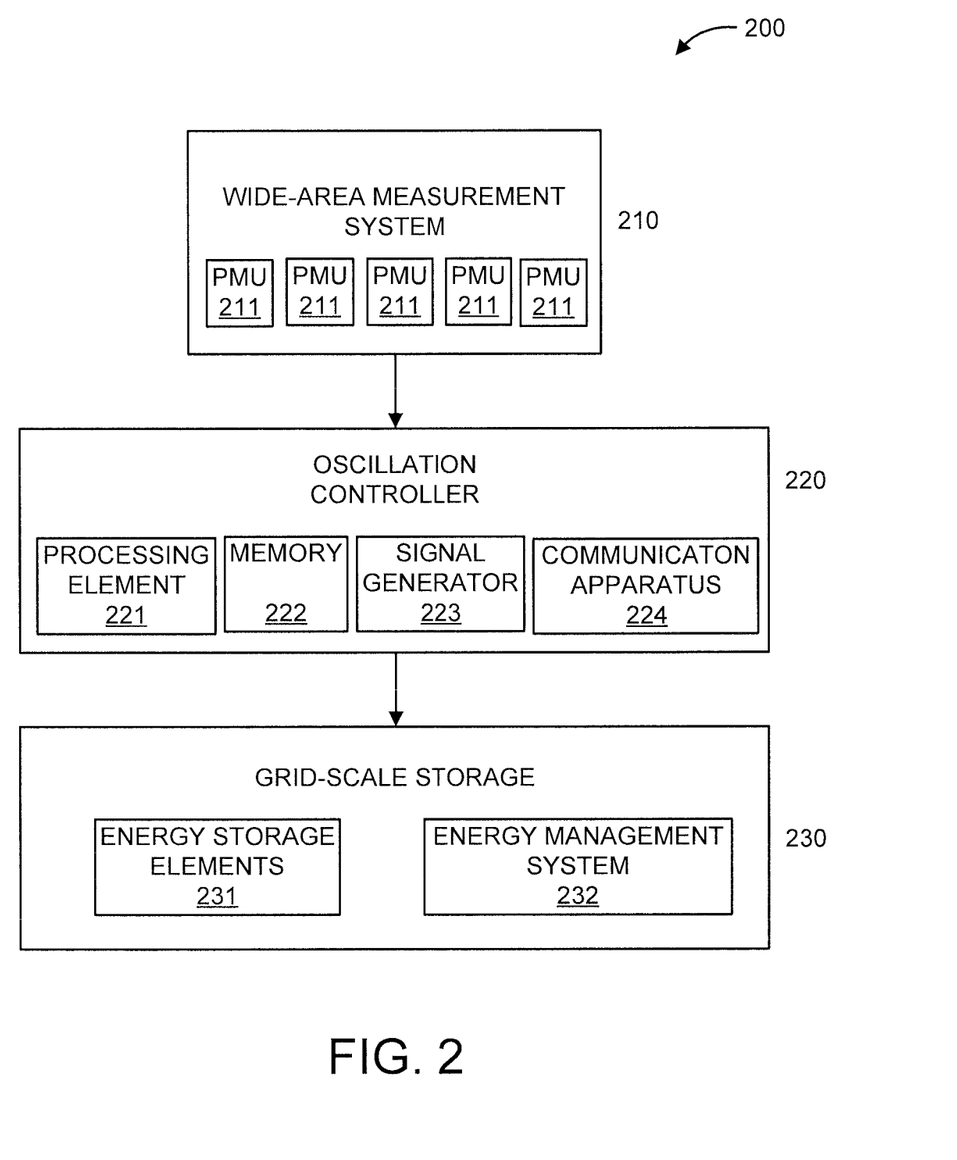
FIG. 2 shows an exemplary system 200 for Wide-area Measurement System (WAMS) based control of Grid-Scale Storage (GSS) for power system stability enhancement, in accordance with an embodiment of the present principles.

Moreover, it is to be appreciated that system 200 described below with respect to FIG. 2 is a system for implementing respective embodiments of the present principles. Part or all of processing system 100 may be implemented in one or more of the elements of system 200.

Figure 3:
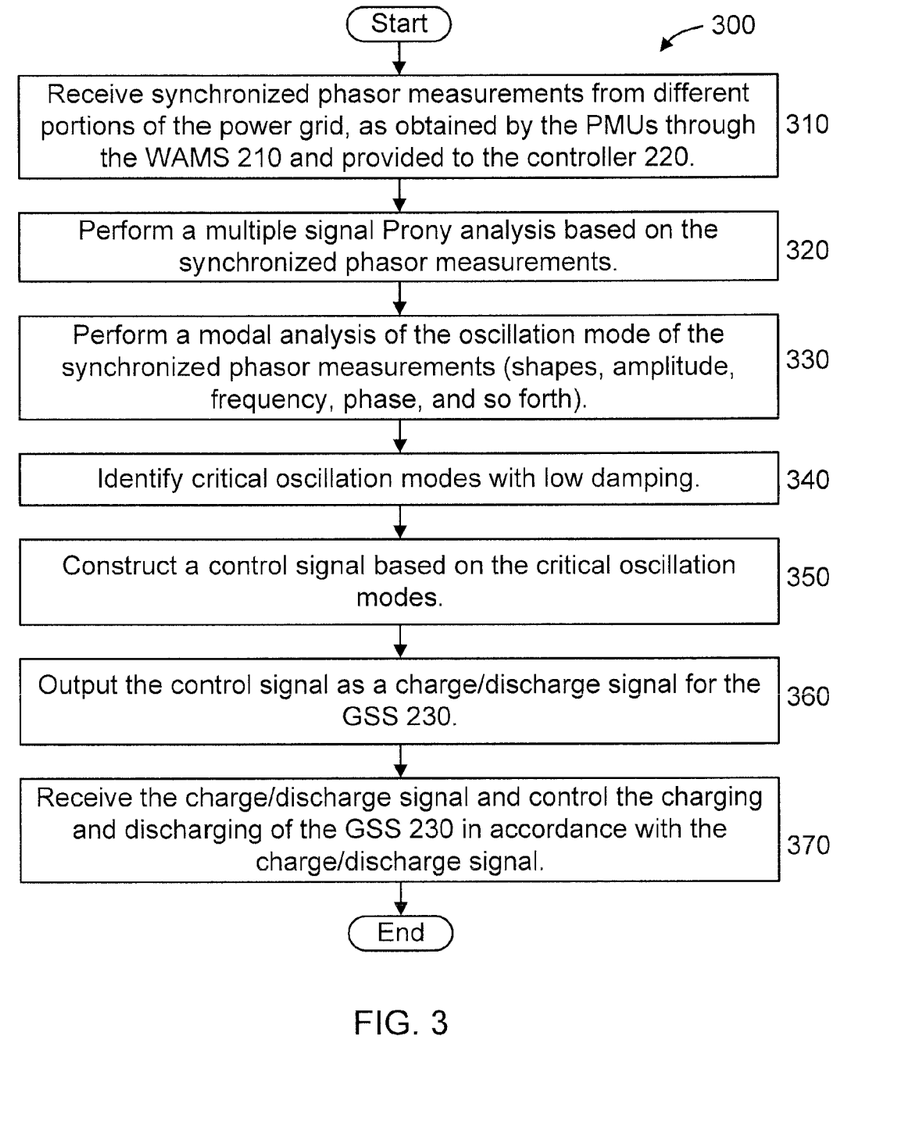
FIG. 3 shows an exemplary method 300 for Wide-area Measurement System (WAMS) based control of Grid-Scale Storage (GSS) for power system stability enhancement using a Prony analysis, in accordance with an embodiment of the present principles.
Figure 4:
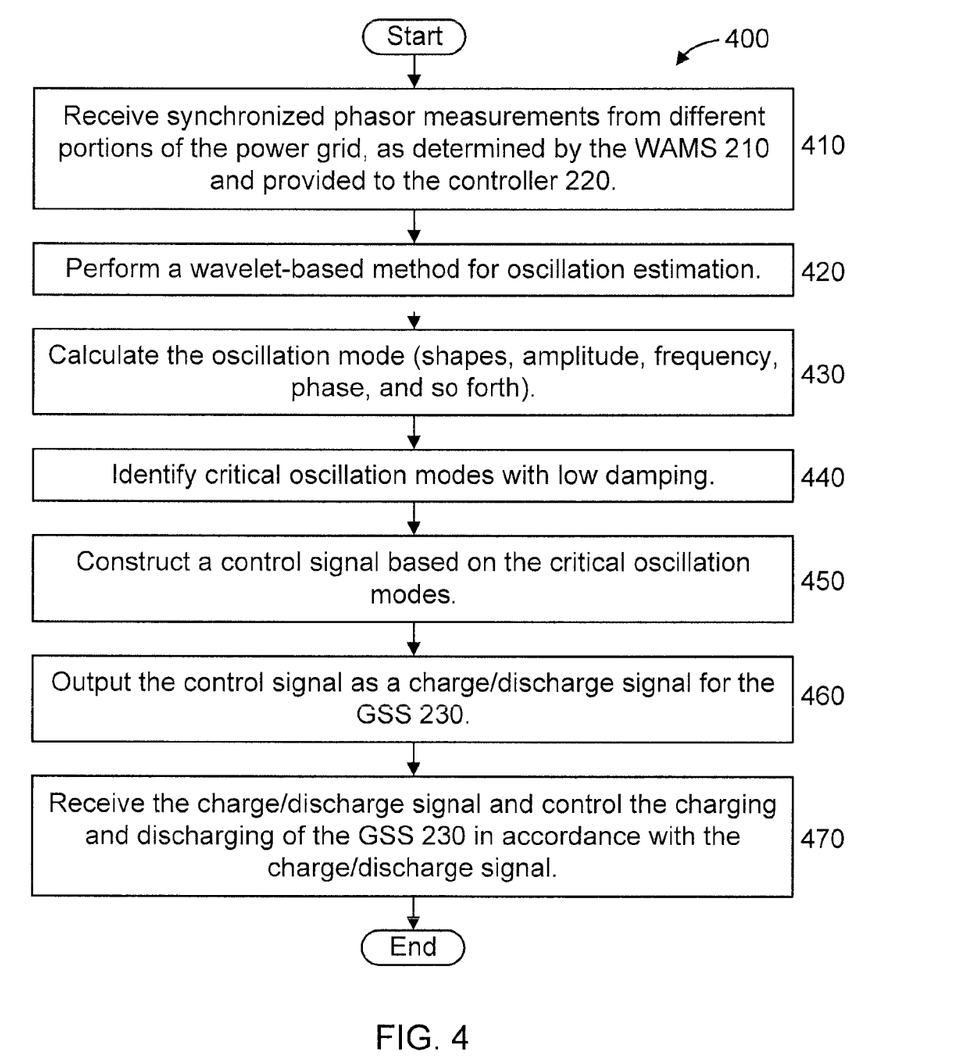
FIG. 4 shows an exemplary method 400 for Wide-area Measurement System (WAMS) based control of Grid-Scale Storage (GSS) for power system stability enhancement using wavelets, in accordance with an embodiment of the present principles.
Figure 5:
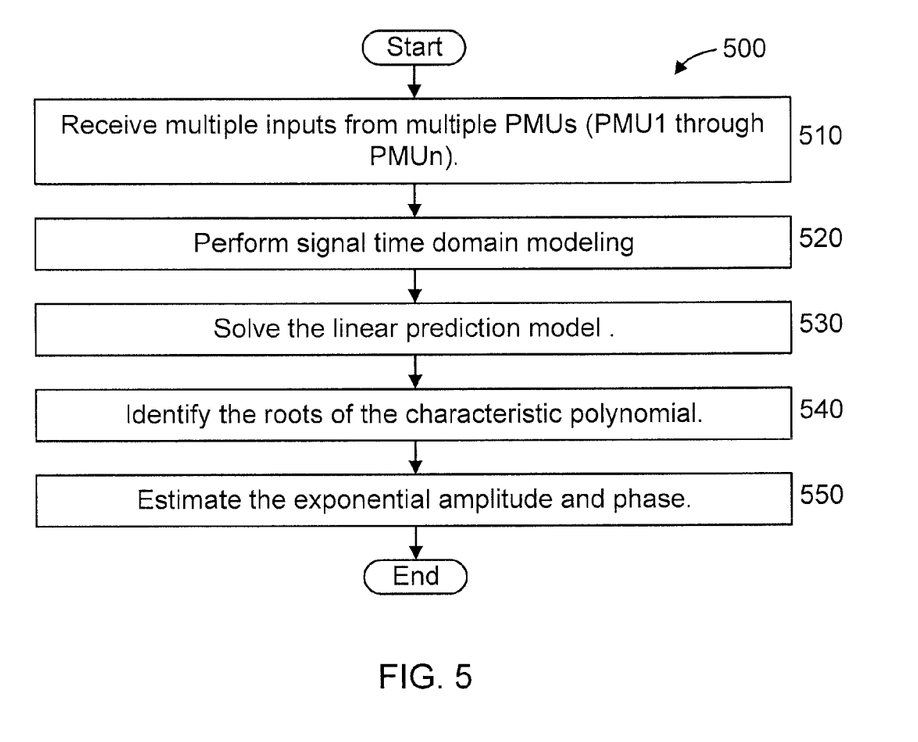
FIG. 5 shows a multi-signal Prony analysis method 500 based on PMU measurements, in accordance with an embodiment of the present principles.
Figure 6:
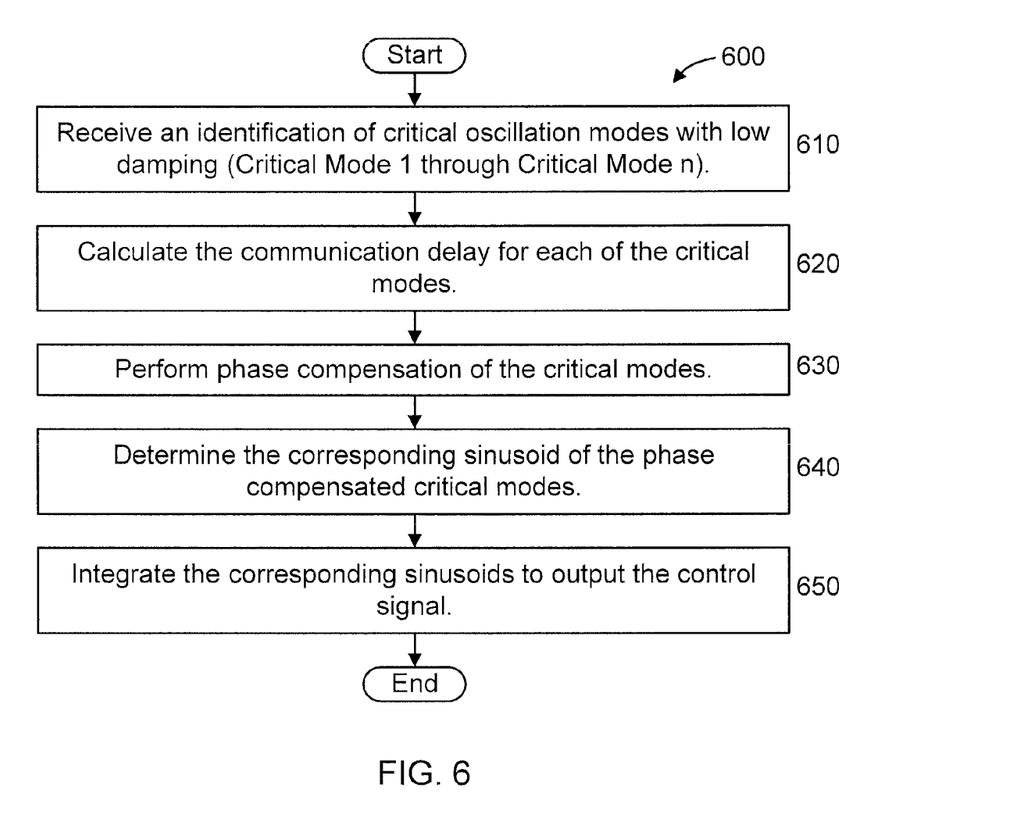
FIG. 6 shows a Grid-Scale Storage (GSS) control signal construction method 600, in accordance with an embodiment of the present principles.

Further, it is to be appreciated that processing system 100 may perform at least part of the method described herein including, for example, at least part of method 300 of FIG. 3 and/or at least part of method 400 of FIG. 4 and/or at least part of method 500 of FIG. 5 and/or at least part of method 600 of FIG. 6. Similarly, part or all of system 200 may be used to perform at least part of method 300 of FIG. 3 and/or at least part of method 400 of FIG. 4 and/or at least part of method 500 of FIG. and/or at least part of method 600 of FIG. 6.

FIG. 2 shows an exemplary system 200 for Wide-area Measurement System (WAMS) based control of Grid-Scale Storage (GSS) for power system stability enhancement, in accordance with an embodiment of the present principles.

The system 200 includes and/or otherwise involves the following elements: a Wide-area Measurement System (WAMS) 210, a hardware-based oscillation controller (hereinafter "controller" in short) 220, and Grid-scale Storage (GSS) 230.

The WAMs 210 include multiple phase measurement units (PMUs) 211 for obtaining phasor measurements from different portions of a power system.

The controller 220 receives data from the WAMS 210 and controls the GSS 230. The controller 220 conducts data analytics and makes control decisions. In an embodiment, the controller 220 is implemented as a computer processing system (e.g., a server) having at least a processing element 221, a corresponding memory 222, a signal generator 223, and a communication apparatus 224 for receiving and transmitting signals.

The GSS 230 includes energy storage elements 231 (e.g., batteries, and so forth) for storing energy for the power system.

The GSS 230 further includes an Energy Management System (EMS) 232 for managing/controlling the GSS 230. The EMS 232 can manage/control the GSS 230 responsive signals generated from the controller 220. Alternatively, the signals generated from the controller 220 can be directly applied to elements of the GSS 230.

Phasor Measurement Unit (PMU) measurements from different parts of the interconnected power system are collected from the WAMS infrastructure. Measurements of the same time tag are input to a Prony Analysis. In general, a Prony analysis can extract valuable information from a uniformly sampled signal and build a series of damped complex exponentials or sinusoids. The use of a Prony analysis allows for the estimation of frequency, amplitude, phase and damping components of the signal. Most Prony analysis are based on a single input signal. Since a power system is a nonlinear system, a Prony analysis tends to be inaccurate since it has the underlying assumption that the system is linear. The multiple signals provided by the WAMS 210 include rich information. One observation is that since the power system is a multiple-output system, all PMU measurements collected by the WAMS 210 should oscillate at the same modes. Using multiple signals as the input of the Prony analysis can greatly improve the accuracy of the estimation. Therefore, all the PMU data collected from WAMS 210 is processed through the Prony analysis to obtain their frequencies, phases, damping coefficients and amplitudes. From the identified modes, the present principles compare their amplitudes, frequencies and damping coefficients to determine the critical modes. These critical modes are typically those with higher amplitudes and lower damping coefficients. From the critical modes, the controller 220 tries to construct a reference control signal that is in the opposite phase of the critical modes and is proportional in magnitude to the summarization of the critical modes. This constructed signal is then used to control the output of the GSS to perform charge and discharge operations so as to damp the corresponding critical oscillation modes.

It is to be appreciated that the key information used for the controller 220 to make control decisions are the oscillation modes. Therefore, any other method that can be used to estimate the modes (frequency, phase, damping, and amplitude) of the oscillation can be used in the controller to replace the Prony analysis.

FIG. 3 shows an exemplary method 300 for Wide-area Measurement System (WAMS) based control of Grid-Scale Storage (GSS) for power system stability enhancement using a Prony analysis, in accordance with an embodiment of the present principles.

At step 310, receive synchronized phasor measurements from different portions of the power grid, as obtained by the PMUs through the WAMS 210 and provided to the controller 220.

At step 320, perform a multiple signal Prony analysis based on the synchronized phasor measurements.

At step 330, perform a modal analysis of the oscillation mode of the synchronized phasor measurements (shapes, amplitude, frequency, phase, and so forth).

At step 340, identify critical oscillation modes with low damping.

At step 350, construct a control signal based on the critical oscillation modes.

At step 360, output the control signal as a charge/discharge signal for the GSS 230.

At step 370, receive the charge/discharge signal and control the charging and discharging of the GSS 230 in accordance with the charge/discharge signal.

FIG. 4 shows an exemplary method 400 for Wide-area Measurement System (WAMS) based control of Grid-Scale Storage (GSS) for power system stability enhancement using wavelets, in accordance with an embodiment of the present principles.

At step 410, receive synchronized phasor measurements from different portions of the power grid, as determined by the WAMS 210 and provided to the controller 220.

At step 420, perform a wavelet-based method for oscillation estimation.

At step 430, calculate the oscillation mode (shapes, amplitude, frequency, phase, and so forth).

At step 440, identify critical oscillation modes with low damping.

At step 450, construct a control signal based on the critical oscillation modes.

At step 460, output the control signal as a charge/discharge signal for the GSS 230.

At step 470, receive the charge/discharge signal and control the charging and discharging of the GSS 230 in accordance with the charge/discharge signal.

FIG. 5 shows a multi-signal Prony analysis method 500 based on PMU measurements, in accordance with an embodiment of the present principles. The method 500 can correspond, for example, to step 320 in method 300.

At step 510, receive multiple inputs from multiple PMUs (PMU1 through PMUn).

At step 520, perform signal time domain modeling.

At step 530, solve the linear prediction model. The power system is modeled as a linear time-invariant (LTI) system at the time step that is being examined. The LTI system can be described as a general linear prediction model as follows using the observed PMU data set:

$$y[k]=a_1 y[k-1]+a_2 y[k-2]+ \ldots +a_L y[k-L],$$

where y[k]'s are the PMU measurements and $a_i$'s are the coefficients to be estimated.

At step 540, identify the roots of the characteristic polynomial.

At step 550, estimate the exponential amplitude and phase.

FIG. 6 shows a Grid-Scale Storage (GSS) control signal construction method 600, in accordance with an embodiment of the present principles. The method 600 can correspond, for example, to step 350 in method 300 and step 450 in method 400.

At step 610, receive an identification of critical oscillation modes with low damping (Critical Mode 1 through Critical Mode n).

At step 620, calculate the communication delay for each of the critical modes.

At step 630, perform phase compensation of the critical modes.

At step 640, determine the corresponding sinusoid of the phase compensated critical modes.

At step 650, integrate the corresponding sinusoids to output the control signal.

Traditional PSS design is based on offline studies and is not very effective for inter-area oscillation and when a power system experiences a large disturbance. The present principles provide an adaptive approach of using GSS for system oscillation damping, which conducts a real-time analysis of the WAMS signals and damps different oscillation modes in the most effective way.

Moreover, the use of multiple PMU measurements as the inputs to a Prony analysis in accordance with the present principles can greatly improve the accuracy of the Prony analysis and can result in better estimate for frequency, amplitude and damping.

A description will now be given of at least some of the many attendant competitive/commercial values/advantages of the present principles.

The WAMS-based GSS control system in accordance with the present principles can improve the damping of an inter-area oscillation mode beyond that of an optimally tuned PSS. Existing PSS design is most effective in damping local oscillation and less effective in damping inter-area oscillation, due to the lack of the wide-area information from a global perspective. In addition, existing PSS design is not helpful when a power system experiences a large disturbance and the system behaves more nonlinearly. The present principles provide an adaptive control method that is based on wide-area information of the power system and will be effective under all system operating conditions whenever critical inter-area oscillation exists. Existing PSS is designed to damp a particular oscillation mode while the present principles can handle multiple oscillation modes at the same time.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method, comprising:
collecting, from a plurality of phasor measurement units by a wide-area measurement system, a plurality of synchronized phasor measurements from different portions of a power system;
estimating, by a hardware-based controller, oscillation modes of the plurality of synchronized phasor measurements, each of the estimated oscillation modes specifying, for each of the plurality of synchronized phasor measurements, two or more of an amplitude, a phase, a frequency, and damping coefficients;
performing, by the hardware-based controller, a modal analysis of the oscillation modes of the plurality of synchronized phasor measurements to identify critical modes based on critical mode identifying criteria;
constructing, by the hardware-based controller based on the critical modes, a power system oscillation damping control signal for controlling a grid-scale storage portion of the power system to damp one or more oscillations of the power system at any given time; and
controlling the grid-scale storage portion of the power system to respectively charge and discharge at opposing phases with respect to a given one of the one or more oscillations to mitigate the given one of the one or more oscillations.

2. The method of claim 1, wherein the critical mode identifying criteria comprises oscillation modes having at least one of (i) an amplitude above a threshold amplitude and (ii) at least one damping coefficient below a damping coefficient threshold.

3. The method of claim 1, wherein the oscillation modes of the plurality of synchronized phasor measurements are estimating using a Prony analysis applied to the plurality of synchronized phasor measurements.

4. The method of claim 1, wherein the oscillation modes of the plurality of synchronized phasor measurements are estimated using a wavelet-based oscillation identification process applied to the plurality of synchronized phasor measurements.

5. The method of claim 1, wherein the oscillation modes of the plurality of synchronized phasor measurements are estimated using signal time domain modeling, linear prediction modeling, and polynomial root identification.

6. The method of claim 1, further comprising controlling one or more operations of the grid-scale storage portion of the power system responsive to the power system oscillation damping control signal.

7. The method of claim 6, wherein the one or more operations include a charging operation and a discharging operation of a power storage element of the grid-scale storage portion.

8. The method of claim 1, wherein the grid-scale storage portion is controlled to charge at a negative peak of the given one of the one or more oscillations and discharge at a positive peak of the given one of the one or more oscillations.

9. The method of claim 1, wherein the power system oscillation damping control signal is constructed as a reference control signal having an opposite phase of the critical modes and proportional in magnitude to a summarization of the critical modes.

10. The method of claim 1, forming a wide-area measurement system based adaptive closed-loop control system for the grid-scale storage portion that damps the one or more oscillations of the power system based on the power system oscillation damping control signal.

11. The method of claim 1, wherein at least one of the one or more oscillations that is damped responsive to the power system oscillation damping control signal is an inter-area oscillation.

12. The method of claim 1, wherein the one or more oscillations comprise at least two oscillations, and wherein the power system oscillation damping control signal controls the grid-scale storage portion to simultaneously damp the at least two oscillations.

13. The method of claim 1, wherein the power system oscillation damping control signal is constructed by phase compensating a respective communication delay for each of the critical modes to output a respective sinusoid therefor, and applying a summarization process to the respective sinusoid for each of the critical modes to obtain a summarized signal as the power system oscillation damping control signal.

14. A non-transitory article of manufacture tangibly embodying a computer readable program which when executed causes a computer to perform the steps of claim 1.

15. A power oscillation control system for a power system, comprising:
   a hardware-based controller having a signal generator, the hardware-based controller configured to:
      receive a plurality of synchronized phasor measurements obtained from different portions of a power system by a plurality of phasor measurement units through a wide-area measurement system;
      estimate oscillation modes of the plurality of synchronized phasor measurements, each of the estimated oscillation modes specifying, for each of the plurality of synchronized phasor measurements, two or more of an amplitude, a phase, a frequency, and damping coefficients;
      perform a modal analysis of the oscillation modes of the plurality of synchronized phasor measurements to identify critical modes based on critical mode identifying criteria;
      construct, based on the critical modes, a power system oscillation damping control signal for controlling a grid-scale storage portion of the power system to damp one or more oscillations of the power system at any given time; and
      control the grid-scale storage portion of the power system to respectively charge and discharge at opposing phases with respect to a given one of the one or more oscillations to mitigate the given one of the one or more oscillations.

16. The power oscillation control system for a power system of claim 15, wherein the oscillation modes of the plurality of synchronized phasor measurements are estimating using a Prony analysis applied to the plurality of synchronized phasor measurements.

17. The power oscillation control system for a power system of claim 15, wherein the power system oscillation damping control signal is constructed as a reference control signal having an opposite phase of the critical modes and proportional in magnitude to a summarization of the critical modes.

18. The power oscillation control system for a power system of claim 15, wherein the one or more oscillations comprise at least two oscillations, and wherein the power system oscillation damping control signal controls the grid-scale storage portion to simultaneously damp the at least two oscillations.

19. The power oscillation control system for a power system of claim 15, wherein the power system oscillation damping control signal is constructed by phase compensating a respective communication delay for each of the critical modes to output a respective sinusoid therefor, and applying a summarization process to the respective sinusoid for each of the critical modes to obtain a summarized signal as the power system oscillation damping control signal.

* * * * *